US010487205B2

(12) United States Patent
Adachi et al.

(10) Patent No.: US 10,487,205 B2
(45) Date of Patent: Nov. 26, 2019

(54) RESIN COMPOSITION FOR FLATTENED FILM OR MICROLENS

(71) Applicant: NISSAN CHEMICAL INDUSTRIES, LTD., Tokyo (JP)

(72) Inventors: Isao Adachi, Funabashi (JP); Takahiro Sakaguchi, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 258 days.

(21) Appl. No.: 15/325,736

(22) PCT Filed: Jul. 3, 2015

(86) PCT No.: PCT/JP2015/069291
§ 371 (c)(1),
(2) Date: Jan. 12, 2017

(87) PCT Pub. No.: WO2016/021348
PCT Pub. Date: Feb. 11, 2016

(65) Prior Publication Data
US 2017/0166737 A1 Jun. 15, 2017

(30) Foreign Application Priority Data
Aug. 8, 2014 (JP) .................. 2014-162368

(51) Int. Cl.
*G02B 3/00* (2006.01)
*G02B 1/04* (2006.01)
(Continued)

(52) U.S. Cl.
CPC ............ *C08L 25/14* (2013.01); *C08F 212/08* (2013.01); *C08F 220/32* (2013.01); *C08L 33/14* (2013.01);
(Continued)

(58) Field of Classification Search
CPC .. C08F 220/32; C08F 2220/325; C08F 12/24; C08F 212/08; G02B 5/223; G02B 1/041;
(Continued)

(56) References Cited

U.S. PATENT DOCUMENTS 5,380,804 A * 1/1995 Lees .................. C08G 59/3209
525/327.3

FOREIGN PATENT DOCUMENTS

JP     S-64-010666 A    1/1989
JP     H06-075375 A    3/1994
(Continued)

OTHER PUBLICATIONS

Computer-generated transaltion of JP 07-003116 (Jan. 1995) (Year: 1995).*
(Continued)

*Primary Examiner* — John A McPherson
(74) *Attorney, Agent, or Firm* — Oliff PLC

(57) ABSTRACT

A thermosetting resin composition for a flattened film or a microlens including: a copolymer having structural units of the following Formulae (1) and (2), wherein $R^0$s are each independently a hydrogen atom or a methyl group, $R^1$ is a single bond or a $C_{1-5}$ alkylene group, in which the alkylene group may have an ether bond in the main chain, and $R^2$ is an epoxy group or a $C_{5-12}$ organic group having an epoxy ring; and a solvent.

(1)

(Continued)

-continued

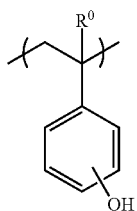
(2)

8 Claims, 1 Drawing Sheet

(51) Int. Cl.
C08L 25/14 (2006.01)
C08L 33/14 (2006.01)
G03F 7/11 (2006.01)
C08F 212/08 (2006.01)
C08F 220/32 (2006.01)
G03F 7/16 (2006.01)
G03F 7/30 (2006.01)
G03F 7/38 (2006.01)

(52) U.S. Cl.
CPC ............... *G02B 1/041* (2013.01); *G03F 7/11* (2013.01); *G03F 7/16* (2013.01); *G03F 7/30* (2013.01); *G03F 7/38* (2013.01); *C08F 2220/325* (2013.01); *C08L 2201/10* (2013.01)

(58) Field of Classification Search
CPC ......... G02F 1/133514; G02F 1/133516; G03F 7/0007
See application file for complete search history.

(56) References Cited

FOREIGN PATENT DOCUMENTS

| JP | H06-112459 A | | 4/1994 |
|---|---|---|---|
| JP | 06-347601 | * | 12/1994 |
| JP | H07-003116 A | | 1/1995 |
| JP | 2921770 B2 | | 7/1999 |
| JP | 2006-113547 A | | 4/2006 |
| JP | 2008-031417 A | | 2/2008 |
| JP | 2010-139822 A | | 6/2010 |
| JP | 2010-237374 A | | 10/2010 |
| JP | 2013-061616 A | | 4/2013 |
| JP | 2014-089453 A | | 5/2014 |
| WO | 2013-005619 A1 | | 1/2013 |
| WO | 2013129250 A1 | | 9/2013 |

OTHER PUBLICATIONS

Computer-generated transaltion of JP 06-0347601 (Dec. 1994) (Year: 1994).*
Sep. 29, 2015 Written Opinion issued in International Patent Application No. PCT/JP2015/069291.
Sep. 29, 2015 Search Report issued in International Patent Application No. PCT/JP2015/069291.
Jul. 2, 2019 Office Action Issued in Japanese Patent Application No. 2016-540120.

* cited by examiner

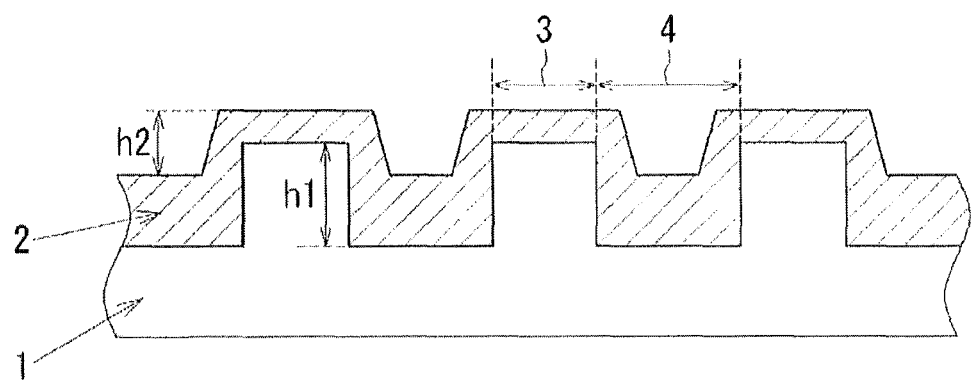

RESIN COMPOSITION FOR FLATTENED FILM OR MICROLENS

TECHNICAL FIELD

The present invention relates to a thermosetting resin composition for a flattened film or a microlens, a method for producing a flattened film using the resin composition, and a method for producing a microlens using the resin composition.

BACKGROUND ART

In a process of producing a CCD/CMOS image sensor, an immersion treatment using a solvent, an alkaline solution, or the like is performed. In order to prevent an element from being deteriorated or damaged by such a treatment, a protective film having resistance to the treatment is provided on a surface of the element. Such a protective film is required to have performances such as transparency, high heat resistance and light resistance, prevention of deterioration such as coloration over an extended period of time, and excellent solvent resistance and alkali resistance (Patent Document 1). In recent years, higher definition of the CCD/CMOS image sensor requires improvement in sensitivity of the sensor. When the protective film is formed on a color filter to efficiently concentrate light from a microlens to a light reception portion, the protective film is required to flatten a level difference that is formed on an underlying substrate (Patent Documents 2 to 4). From such a protective film, a microlens is also produced.

A known method for producing a microlens for a CCD/CMOS image sensor is an etch back method (Patent Documents 5 and 6). In the method, a resist pattern is formed on a resin film for a microlens that is formed on a color filter, and then reflowed by heat treatment, forming a lens pattern. The resin film for a microlens as an underlayer is subjected to an etch back process using, as an etching mask, the lens pattern formed by reflowing the resist pattern to transfer the lens pattern shape to the resin film for a microlens. Thus, a microlens is produced.

On the other hand, in a case of conventional pigment dispersion, it is difficult to further improve resolution of a color filter for a CCD/CMOS image sensor. The conventional pigment dispersion has a problem such as occurrence of color unevenness due to coarse and large particles of the pigment. Therefore, the conventional pigment dispersion is not suitable for applications requiring a fine pattern, such as a solid-state imaging element. Accordingly, a technique using a dye instead of the pigment dispersion has been proposed (Patent Document 7). However, the technique has difficultly when applied to a color filter using a dye in which decomposition is generally started at about 180° C. (Patent Document 8) since the conventional thermosetting protective film is baked at a temperature of 180° C. or higher.

PRIOR ART DOCUMENTS

Patent Documents

Patent Document 1: Japanese Patent No. 2921770
Patent Document 2: International Publication WO 2013/005619
Patent Document 3: Japanese Patent Application Publication No. 2008-31417 (JP 2008-31417 A)
Patent Document 4: Japanese Patent Application Publication No. 2006-113547 (JP 2006-113547 A)
Patent Document 5: Japanese Patent Application Publication No. H01-10666 (JP H01-10666 A)
Patent Document 6: Japanese Patent Application Publication No. H06-112459 (JP H06-112459 A)
Patent Document 7: Japanese Patent Application Publication No. H06-75375 (JP H06-75375 A)
Patent Document 8: Japanese Patent Application Publication No. 2010-237374 (JP 2010-237374 A)

SUMMARY OF THE INVENTION

Problem to be Solved by the Invention

The present invention is made in view of the circumstances, and an object of the present invention is to provide a thermosetting resin composition that has excellent transparency, solvent resistance, and flatness and can be cured at a desired temperature of higher than 100° C.

Means for Solving the Problems

The inventors of the present invention have intensively studied to solve the problems, and as a result, have completed the present invention.

Specifically, as a first aspect is a resin composition for a flattened film or a microlens comprising:

a copolymer having structural units of Formula (1) and Formula (2):

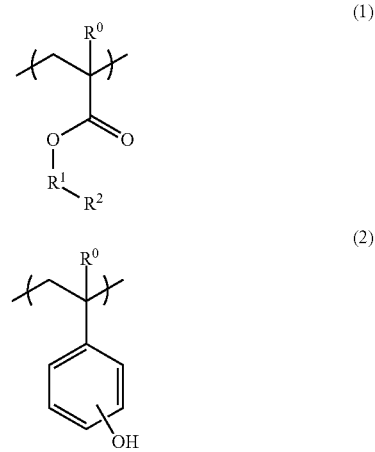

(wherein $R^0$s are each independently a hydrogen atom or a methyl group, $R^1$ is a single bond or a $C_{1-5}$ alkylene group, in which the alkylene group may have an ether bond in the main chain, and $R^2$ is an epoxy group or a $C_{5-12}$ organic group having an epoxy ring); and a solvent.

A second aspect is the resin composition for a flattened film or a microlens according to the first aspect, wherein the structural unit of Formula (1) is represented by the following Formula (1-1) or (1-2):

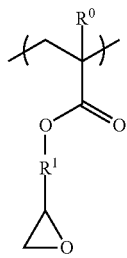

(1-1)

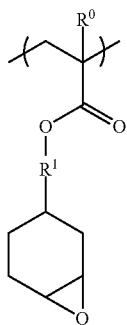

(1-2)

(wherein $R^0$ is a hydrogen atom or a methyl group, and $R^1$ is a single bond or a $C_{1-5}$ alkylene group, in which the alkylene group may have an ether bond in the main chain).

A third aspect is the resin composition for a flattened film or a microlens according to the first or second aspect, wherein the copolymer is a copolymer further having a structural unit of the following Formula (3):

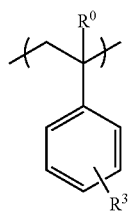

(3)

(wherein $R^0$ is a hydrogen atom or a methyl group, and $R^3$ is a hydrogen atom, a $C_{1-10}$ alkyl group, a $C_{1-10}$ alkoxy group, a cyano group, a carboxyl group, a phenyl group, or a halogeno group).

A fourth aspect is the resin composition for a flattened film or a microlens according to any one of the first to third aspects, further comprising a catalyst for accelerating curing of the copolymer.

A fifth aspect is the resin composition for a flattened film or a microlens according to any one of the first to fourth aspects, wherein the catalyst is contained in an amount of 0.1% by mass to 20% by mass relative to the content of solid of the resin composition except for the solvent.

A sixth aspect is the resin composition for a flattened film or a microlens according to any one of the first to fifth aspects, wherein the copolymer has a weight average molecular weight of 1,000 to 50,000.

A seventh aspect of the present invention is a flattened film that is produced by applying the resin composition according to any one of the first to sixth aspects to a substrate, followed by baking at a temperature of higher than 100° C. and lower than 180° C.

An eighth aspect is a method for producing the flattened film according to the seventh aspect, wherein the resin composition is applied to a color filter that is formed on the substrate.

A ninth aspect is a method for producing a microlens comprising:
applying the resin composition according to any one of the first to sixth aspects to a substrate having a color filter;
baking the resin composition at a temperature of higher than 100° C. and lower than 180° C. to form a resin film;
forming a resist pattern on the resin film;
reflowing the resist pattern to form a lens pattern; and
performing an etch back process of the resin film using the lens pattern as an etching mask.

Effects of the Invention

A resin composition of the present invention contains a self-crosslinkable copolymer having an epoxy group or an epoxy ring and a hydroxy group. For this reason, the resin composition does not necessarily contain a crosslinker, and has thermosetting properties at a desired temperature of higher than 100° C. and lower than 180° C., for example, 140° C. A resin film formed from the resin composition of the present invention has excellent transparency, solvent resistance, and flatness. Therefore, the resin film formed from the resin composition of the present invention allows a level difference formed on an underlying substrate to be flattened. When a resist is applied after formation of the resin film formed from the resin composition of the present invention and an electrode/wiring forming process is performed after formation of a flattened film or a microlens, the resin film can significantly reduce problems such as mixing with the resist and deformation and separation of the flattened film or the microlens due to an organic solvent. Accordingly, the resin composition of the present invention is suitable for a material forming a flattened film or a microlens.

BRIEF DESCRIPTION OF THE DRAWINGS

FIG. 1 is a schematic view showing a resin film formed by applying a resin composition of the present invention to a substrate with a level difference, followed by baking.

MODES FOR CARRYING OUT THE INVENTION

Each component in the present invention will be described in detail hereinafter. A solid content of a resin composition of the present invention except for a solvent is usually 1% by mass to 50% by mass.

<Copolymer>

A copolymer contained in the resin composition of the present invention is a copolymer having structural units of Formulae (1) and (2):

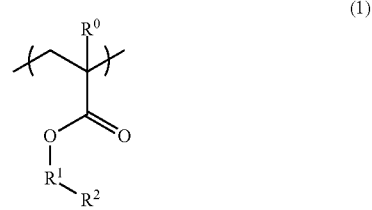

(1)

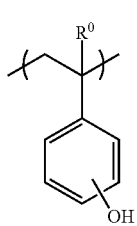

(2)

(wherein R⁰s are each independently a hydrogen atom or a methyl group, $R^1$ is a single bond or a $C_{1-5}$ alkylene group, in which the alkylene group may have an ether bond in the main chain, and $R^2$ is an epoxy group or a $C_{5-12}$ organic group having an epoxy ring).

Examples of the structural unit of Formulae (1) include structural units of the following Formula (1-1) or (1-2).

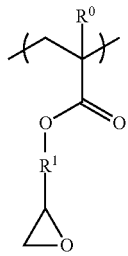

(1-1)

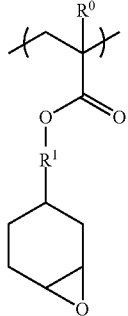

(1-2)

(wherein $R^0$ is a hydrogen atom or a methyl group, and $R^1$ is a single bond or a $C_{1-5}$ alkylene group).

The copolymer may be a copolymer further having a structural unit of the following Formula (3):

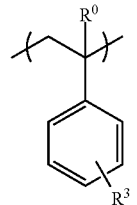

(3)

(wherein $R^0$ is a hydrogen atom or a methyl group, $R^3$ is a hydrogen atom, a $C_{1-10}$ alkyl group, a $C_{1-10}$ alkoxy group, a cyano group, a carboxyl group, a phenyl group, or a halogeno group).

Specific examples of a compound (monomer) forming the structural unit of Formula (3) include styrene, α-methylstyrene, 2-methylstyrene, 3-methylstyrene, 4-methylstyrene, 4-tert-butylstyrene, 4-methoxystyrene, 4-cyanostyrene, 4-vinylbenzoic acid, 4-vinylbiphenyl, 4-fluorostyrene, 4-chlorostyrene, and 4-bromostyrene. These compounds may be used alone or two or more kinds thereof may be used in combination.

The content of the structural unit of Formula (1) in the copolymer is, for example, 10% by mole to 90% by mole, and preferably 20% by mole to 70% by mole. The content of the structural unit of Formula (2) is, for example, 10% by mole to 90% by mole, and preferably 20% by mole to 80% by mole. When the copolymer further has the structure unit of Formula (3), the content of the structural unit of Formula (3) is, for example, 10% by mole to 90% by mole, and preferably 20% by mole to 70% by mole.

The copolymer generally has a weight average molecular weight of 1,000 to 50,000, and preferably 3,000 to 30,000. The weight average molecular weight is a value determined by gel permeation chromatography (GPC) using polystyrene as a standard sample.

The content of the copolymer in the resin composition of the present invention is generally 1% by mass to 99% by mass, and preferably 5% by mass to 95% by mass relative to the solid content of the resin composition.

In the present invention, a method for preparing the copolymer is not particularly limited. In general, the copolymer can be obtained by a polymerization reaction of a monomer mixture containing a monomer species used to obtain the copolymer, in a polymerization solvent at a typical temperature of 50° C. to 120° C. The copolymer prepared in this manner is typically obtained in a form of a solution in which the copolymer is dissolved in a solvent, and the solution may be used for the resin composition of the present invention as it is without isolation.

The copolymer solution obtained as described above may be poured to a poor solvent such as hexane, diethyl ether, methanol, and water, with stirring to reprecipitate the copolymer. The resulting precipitate may be filtered, washed, and then dried at ambient temperature or by heating under ambient pressure or reduced pressure, to obtain the copolymer as a powder. Such an operation can remove a polymerization initiator and an unreacted compound coexistent with the copolymer. In the present invention, the copolymer powder may be used as it is or the copolymer may be used in a form of a solution in which the powder is redissolved, for example, in a solvent described later.

<Curing Accelerating Catalyst>

A catalyst contained in the resin composition of the present invention is a catalyst for accelerating curing of the copolymer, which is sometimes referred to as curing accelerating catalyst or curing accelerator. 1,8-diazabisyclo[5.4.0]undecene-7 or an organic acid salt thereof, imidazole, phosphine, or a phosphonium salt may be used.

Examples of commercially available products of the curing accelerating catalyst include DBU (registered trademark), U-CAT (registered trademark) SA 1, U-CAT (registered trademark) SA 102, U-CAT (registered trademark) SA 106, U-CAT (registered trademark) SA 506, and U-CAT (registered trademark) SA 603 (all available from San-Apro Ltd.), CUREZOL (registered trademark) 2E4MZ (available from Shikoku Chemicals Corporation), and HOKKO TPP (registered trademark) and TPP-MK (registered trademark) (all available from HOKKO CHEMICAL INDUSTRY CO., LTD.). These curing accelerating catalysts may be used alone or two or more kinds thereof may be used in combination.

The content of the curing accelerating catalyst in the resin composition of the present invention is generally 0.1% by mass to 20% by mass relative to the solid content of the resin composition.

A method for preparing the resin composition of the present invention is not particularly limited, and examples of the method include a method in which the copolymer is dissolved in a solvent to obtain a solution, and the curing accelerating catalyst is mixed in the solution at a predetermined ratio, to make the solution homogeneous. Another example is a method in which another additive is further added and mixed, if necessary, at an appropriate step in the preparation method.

The solvent is not particularly limited as long as the solvent is capable of dissolving the copolymer and the curing accelerating catalyst. Examples of such a solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, propylene glycol monobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl acetate, butyl acetate, ethyl lactate, butyl lactate, 2-heptanone, and γ-butyrolactone. These solvents may be used alone or two or more kinds thereof may be used in combination.

Among the solvents, from the viewpoints of improved leveling properties of a coated film formed by applying the resin composition of the present invention to a substrate, propylene glycol monomethyl ether, propylene glycol monomethyl ether acetate, 2-heptanone, ethyl lactate, butyl lactate, and cyclohexanone are preferred.

The resin composition of the present invention may contain a surfactant in order to improve coating properties. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including Eftop (registered trademark) EF301, EF303, and EF352 (all available from Mitsubishi Materials Electronic Chemicals Co., Ltd.), MEGAFACE (registered trademark) F-171, F-173, R-30, R-40, and R-40-LM (all available from DIC Corporation), Fluorad FC430 and FC431 (all available from Sumitomo 3M, Ltd.), Asahi Guard (registered trademark) AG710 and Surflon (registered trademark) S-382, SC101, SC102, SC103, SC104, SC105, and SC106 (available from Asahi Glass Co., Ltd.), and FTERGENT series such as FTX-206D, FTX-212D, FTX-218, FTX-220D, FTX-230D, FTX-240D, FTX-212P, FTX-220P, FTX-228P, FTX-240G, and DFX-18 (available from NEOS COPANY LIMITED), and organosiloxane polymer KP341 (available from Shin-Etsu Chemical Co., Ltd.). These surfactants may be used alone or two or more kinds thereof may be used in combination.

When the surfactant is used, the content of the surfactant in the resin composition of the present invention is 0.001% by mass to 3% by mass or less, preferably 0.01% by mass to 1% by mass or less, and more preferably 0.05% by mass to 0.5% by mass or less relative to the solid content of the resin composition.

The resin composition of the present invention may contain additives such as a crosslinker, an ultraviolet absorber, a sensitizer, a plasticizer, an antioxidant, and a bonding aid, if necessary, as long as the effects of the invention are not impaired.

A usage example of the resin composition of the present invention will be described hereinafter.

To a substrate (for example, a semiconductor substrate of silicon or the like, coated with a silicon oxide film, a semiconductor substrate of silicon or the like, coated with a silicon nitride film or a silicon oxynitride film, a semiconductor substrate of silicon or the like, having a color filter, a silicon nitride substrate, a quartz substrate, a glass substrate (including a non-alkali glass, a low-alkali glass, and a crystallized glass), and a glass substrate having an ITO film formed thereon), the resin composition of the present invention is applied by an appropriate coating procedure such as a spinner and a coater, and then is baked and cured by a heating means such as a hot plate to form a resin film for a flattened film or a microlens.

The baking condition is appropriately selected from a baking temperature of 80° C. to 300° C. and a baking time of 0.3 minutes to 60 minutes. The baking may be performed in two or more stages at different baking temperatures that are within the aforementioned temperature range. In the resin composition of the present invention, a desired resin film may be formed at a baking temperature of lower than 180° C.

The resin film formed from the resin composition of the present invention has a thickness of 0.005 μm to 5.0 μm, and preferably 0.01 μm to 3.0 μm.

To the resin layer for a microlens formed from the resin composition of the present invention, a resist solution is then applied, and exposed through a predetermined mask. Post exposure bake (PEB) is performed, if necessary, and alkali development, rinsing, and drying are performed. A predetermined resist pattern is thus formed. For example, g-ray, i-ray, a KrF excimer laser, or an ArF excimer laser may be used in the exposure.

Subsequently, a heat treatment (generally at a temperature not exceeding 200° C.) allows the resist pattern to reflow, forming a lens pattern. The resin film for a microlens as an underlayer is subjected to an etch back process using the lens pattern as an etching mask, to transfer the lens pattern shape to the resin layer for a microlens. Thus, a microlens is produced.

EXAMPLES

Hereinafter, the present invention will be described in more detail with reference to Examples, but the present invention is not limited to Examples.

[Measurement of Weight Average Molecular Weight of Copolymers Shown in Table 1 Below]
Device: GPC system manufactured by JASCO Corporation
Column: Shodex (registered trademark) KF-804L and KF-803L Column oven: 40° C.
Flow rate: 1 mL/min
Eluent: tetrahydrofuran

[Abbreviations used in Examples]

Abbreviations used in the following Examples mean the followings.

GMA: glycidyl methacrylate
4-HS: 4-hydroxystyrene
St: styrene
TPP: triphenylphosphine
jER828: epoxy resin jER (registered trademark) 828 (trade name) available from Mitsubishi Chemical Corporation
DFX-18: surfactant FTERGENT (registered trademark) DFX-18 (trade name) available from NEOS COMPANY LIMITED
PGME: propylene glycol monomethyl ether
PGMEA: propylene glycol monomethyl ether acetate Examples 1 to 3 and Comparative Example 1

In accordance with a composition shown in Table 1, a copolymer, a crosslinker, a curing accelerating catalyst, a surfactant, and a solvent were mixed to obtain a homogeneous solution. In Example 1, a crosslinker and a curing accelerating catalyst were not used. In Example 2, a crosslinker was not used. In Example 3, a crosslinker and a cross-linking accelerating catalyst were not used. The solution was then filtered through a polyethylene microfilter having a pore size of 0.10 μm to prepare a resin composition.

TABLE 1

| | Copolymer | Cross-linker | Curing accelerating catalyst | Surfactant | Solvent |
|---|---|---|---|---|---|
| Example 1 | GMA:4-HS = 20:80 (% by mole) (Weight average molecular weight = 19,000) (10.0 g) | — | — | DFX-18 (0.01 g) | PGME (51.4 g) PGMEA (22.0 g) |
| Example 2 | GMA:4-HS = 20:80 (% by mole) (Weight average molecular weight = 19,000) (10.0 g) | — | TPP (0.2 g) | DFX-18 (0.01 g) | PGME (52.4 g) PGMEA (22.5 g) |
| Example 3 | GMA:4-HS:St = 45:30:25 (% by mole) (Weight average molecular weight = 15,000) (10.0 g) | — | — | DFX-18 (0.01 g) | PGME (51.4 g) PGMEA (22.0 g) |
| Comparative Example 1 | 4-HS = 100 (% by mole) (Weight average molecular weight = 20,000) (10.0 g) | jER828 (3.0 g) | TPP (0.2 g) | DFX-18 (0.01 g) | PGME (67.8 g) PGMEA (29.1 g) |

[Solvent Resistance Test]

Each resin composition prepared in Examples 1 to 3 and Comparative Example 1 was applied to a silicon wafer with a spin coater and baked on a hot plate at 100° C. for 1 minute and then at 140° C. for 10 minutes, to form a resin film having a thickness of 0.6 μm. Each resin film was immersed in each of propylene glycol monomethyl ether, propylene glycol monomethyl ether acetate, cyclohexanone, ethyl lactate, butyl acetate, acetone, γ-butyrolactone, methyl ethyl ketone, 2-heptanone, 2-propanol, and 2.38% by mass tetramethylammonium hydroxide (TMAH) aqueous solution under a temperature condition of 23° C. for 5 minutes. A change in thickness of each film before and after the immersion was measured. The solvent resistance of a film having an increase or decrease of thickness of 5% or more relative to the film thickness before the immersion in at least one of the immersion solvents was evaluated as "×," and the solvent resistance of a film having an increase or decrease of thickness of less than 5% relative to the film thickness before the immersion in each of all the solvents was evaluated as "○." The evaluation results are shown in Table 2.

[Measurement of Transmittance]

Each resin composition prepared in Examples 1 to 3 was applied to a quartz substrate with a spin coater and baked on a hot plate at 100° C. for 1 minute and then at 140° C. for 10 minutes, to form a resin film having a thickness of 0.6 μm. The transmittance of each film was measured at a wavelength of 400 nm with an ultraviolet-visible spectrophotometer UV-2550 (manufactured by Shimadzu Corporation). The evaluation results are shown in Table 2.

[Storage Stability]

Each resin composition prepared in Examples 1 to 3 was applied to a silicon wafer with a spin coater and baked on a hot plate at 100° C. for 1 minute and then at 140° C. for 10 minutes, to form a resin film. The thickness of the resin film was measured with an optical interference thickness meter Lambda Ace VM-2110 (manufactured by Dainippon Screen Mfg. Co., Ltd.). The same resin composition was stored at 35° C. (acceleration test) for one month. After the storage, a resin film was formed from the resin composition in the same manner, and the thickness of the film was measured. As compared with the thickness of the resin film formed from the resin composition immediately after preparation, a resin film having a change of thickness of less than 10% was evaluated as "○", and a resin film having a change of thickness of 10% or more was evaluated as "×." The evaluation results are shown in Table 2.

[Level Difference Planarization Properties]

Each resin composition prepared in Examples 1 to 3 was applied to a substrate having a level difference with a height of 0.3 μm, a line width of 10 μm, and a space between lines of 10 μm (shown in FIG. 1) with a spin coater and baked on a hot plate at 100° C. for 1 minute and then at 140° C. for 10 minutes, to obtain a film having a thickness of 0.6 μm. From h1 (a level difference of a substrate 1 with a level difference) and h2 (a film thickness difference of a resin film 2, that is, a difference between the height of the resin film on the line and the height of the resin film on the space) shown in FIG. 1, the planarization ratio was calculated in accordance with "Equation: $(1-(h2/h1)) \times 100$." The evaluation results are shown in Table 2.

[Measurement of Dry Etching Rate]

An etcher and an etching gas used in measurement of a dry etching rate are as follows.

Etcher: RIE-10NR (available from SAMCO INC.)
Etching gas: $CF_4$

Each resin composition prepared in Examples 1 to 3 was applied to a silicon wafer with a spin coater and baked on a hot plate at 100° C. for 1 minute and then at 140° C. for 10 minutes, to form a resin film having a thickness of 0.6 μm. The dry etching rate of each film was measured with the etcher and the etching gas mentioned above. In the same manner, a resist solution (THMR-iP1800 (available from TOKYO OHKA KOGYO CO., LTD.) was applied to a silicon wafer with a spin coater and baked on a hot plate at 90° C. for 1.5 minutes to obtain a resist film having a thickness of 1 μm. The dry etching rate was then measured. The ratio of the dry etching rate of the film obtained from each resin composition prepared in Examples 1 to 3 to that of the resist film was determined. The evaluation results are shown in Table 2.

TABLE 2

|  | Solvent resistance | Transmittance/ % (Wavelength: 400 nm) | Storage stability | Planarization ratio | Dry etching rate ratio (relative to resist film) |
|---|---|---|---|---|---|
| Example 1 | ○ | 95 | ○ | 58% | 1.0 |
| Example 2 | ○ | 95 | ○ | 60% | 1.0 |
| Example 3 | ○ | 95 | ○ | 50% | 1.0 |
| Comparative Example 1 | X | — | — | — | — |

As seen from the results in Table 2, the resin film formed from the resin composition of the present invention had high solvent resistance and high transparency. The resin composition of the present invention was also found to have excellent storage stability. The resin film formed from the resin composition of the present invention had level difference planarization properties of a planarization ratio of 50% or more. For accurate transfer of a lens pattern shape to a resin film as an underlayer in production of a microlens by an etch back method, a dry etching rate X of the resist film and a dry etching rate Y of the resin film are required to be substantially equal (X:Y=1:0.8 to 1.2). The resin film formed from the resin composition of the present invention satisfied the requirement. In contrast, the film formed from the resin composition prepared in Comparative Example 1 did not satisfy solvent resistance and was suitable for neither a flattened film nor a microlens.

DESCRIPTION OF SYMBOLS

1: Substrate with level difference
2: Resin film
3: Line width
4: Space between lines
h1: Level difference of substrate with level difference
h2: Level difference of resin film

The invention claimed is:

1. A resin composition for a flattened film or a microlens consisting of:
   a phosphine;
   a copolymer having structural units of the following Formulae (1) and (2):

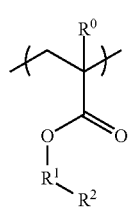
(1)

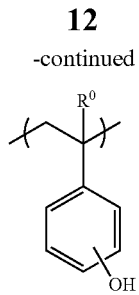
(2)

wherein $R^0$s are each independently a hydrogen atom or a methyl group, $R^1$ is a single bond or a $C_{1-5}$ alkylene group, in which the alkylene group may have an ether bond in the main chain, and $R^2$ is an epoxy group or a $C_{5-12}$ organic group having an epoxy ring;
a solvent;
and, optionally, a surfactant.

2. The resin composition for a flattened film or a microlens according to claim 1, wherein the structural unit of Formula (1) is represented by the following Formula (1-1) or (1-2):

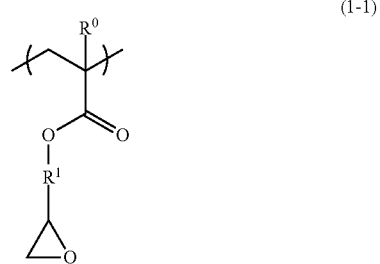
(1-1)

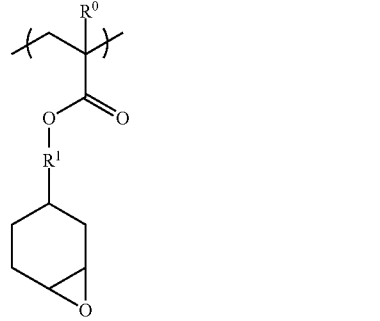
(1-2)

wherein $R^0$ and $R^1$ each have the same definition as in claim 1.

3. The resin composition for a flattened film or a microlens according to claim 1, wherein the copolymer is a copolymer further having a structural unit of the following Formula (3):

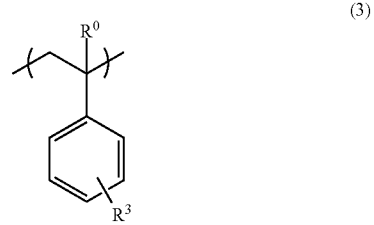
(3)

wherein $R^0$ has the same definition as in claim 1, and $R^3$ is a hydrogen atom, a $C_{1-10}$ alkyl group, a $C_{1-10}$ alkoxy group, a cyano group, a carboxyl group, a phenyl group, or a halogeno group.

4. The resin composition for a flattened film or a microlens according to claim 1, wherein the phosphine is contained in an amount of 0.1% by mass to 20% by mass relative to the content of solid of the resin composition except for the solvent.

5. The resin composition for a flattened film or a microlens according to claim 1, wherein the copolymer has a weight average molecular weight of 1,000 to 50,000.

6. A method for producing a flattened film comprising applying the resin composition according to claim 1 to a substrate, followed by baking at a temperature of higher than 100° C. and lower than 180° C.

7. The method for producing the flattened film according to claim 6, wherein the resin composition is applied to a color filter that is formed on the substrate.

8. A method for producing a microlens comprising:
applying the resin composition according to claim 1 to a substrate having a color filter;
baking the resin composition at a temperature of higher than 100° C. and lower than 180° C. to form a resin film;
forming a resist pattern on the resin film;
reflowing the resist pattern to form a lens pattern; and
performing an etch back process of the resin film using the lens pattern as an etching mask.

\* \* \* \* \*